United States Patent
Hamouda

(10) Patent No.: US 10,262,099 B2
(45) Date of Patent: Apr. 16, 2019

(54) METHODOLOGY FOR MODEL-BASED SELF-ALIGNED VIA AWARENESS IN OPTICAL PROXIMITY CORRECTION

(71) Applicant: GLOBALFOUNDRIES INC., Grand Cayman (KY)

(72) Inventor: Ayman Hamouda, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 86 days.

(21) Appl. No.: 15/444,899

(22) Filed: Feb. 28, 2017

(65) Prior Publication Data

US 2018/0247008 A1    Aug. 30, 2018

(51) Int. Cl.
*G06F 17/50* (2006.01)
*G03F 1/36* (2012.01)

(52) U.S. Cl.
CPC ............ *G06F 17/5081* (2013.01); *G03F 1/36* (2013.01)

(58) Field of Classification Search
CPC ............... H01L 23/5226; H01L 23/528; H01L 21/76897; H01L 21/76816; G06F 17/5072; G06F 17/5081; G06F 17/5009; G06F 17/5077

USPC .................... 716/50–55; 430/5, 30
See application file for complete search history.

(56) References Cited

U.S. PATENT DOCUMENTS

| | | | |
|---|---|---|---|
| 8,745,550 B2 | 6/2014 | Cheng et al. | |
| 9,922,161 B2 * | 3/2018 | Kahng | G06F 17/5081 |
| 2007/0220476 A1 | 9/2007 | Mukherjee et al. | |
| 2013/0157178 A1 * | 6/2013 | Tsai | G03F 1/70 430/5 |
| 2014/0093814 A1 * | 4/2014 | Chen | G03F 1/36 430/5 |
| 2015/0040091 A1 * | 2/2015 | Hamouda | G06F 17/5072 716/119 |
| 2015/0279784 A1 * | 10/2015 | Zhang | H01L 21/76808 257/750 |

* cited by examiner

*Primary Examiner* — Nghia M Doan
(74) *Attorney, Agent, or Firm* — David Cain; Hoffman Warnick LLC

(57) ABSTRACT

A method of providing self-aligned via (SAV) awareness in optical proximity correction (OPC) includes identifying non-SAV edges, identifying any lower metal structure that is within a critical distance from the non-SAV edges, and defining replacement non-SAV edges proximate to the lower metal structure using a distance constraint that is evaluated as part of the OPC objective function to redefine the mask solution and relocate at least one non-SAV edge away from the lower metal structure.

16 Claims, 13 Drawing Sheets

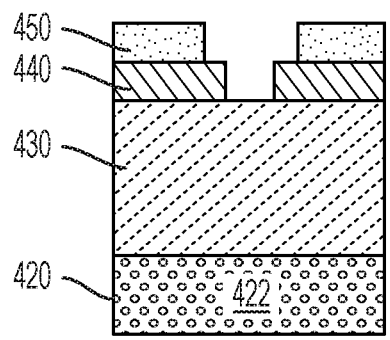
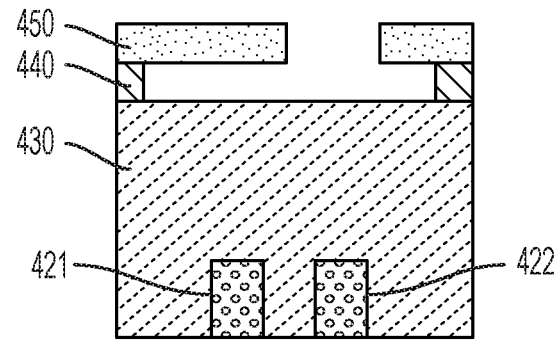
FIG. 2A    FIG. 2B
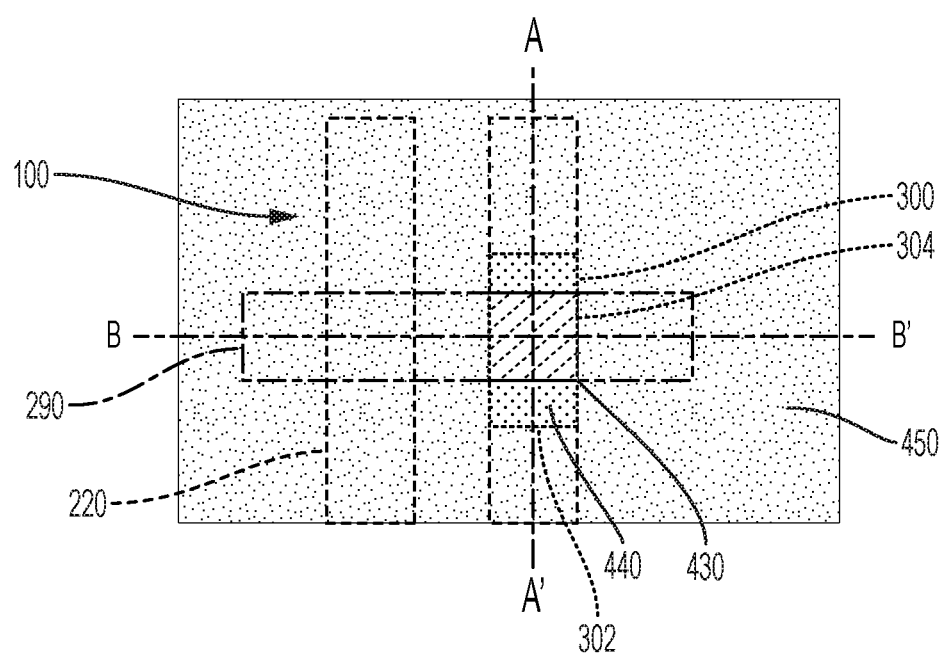
FIG. 2

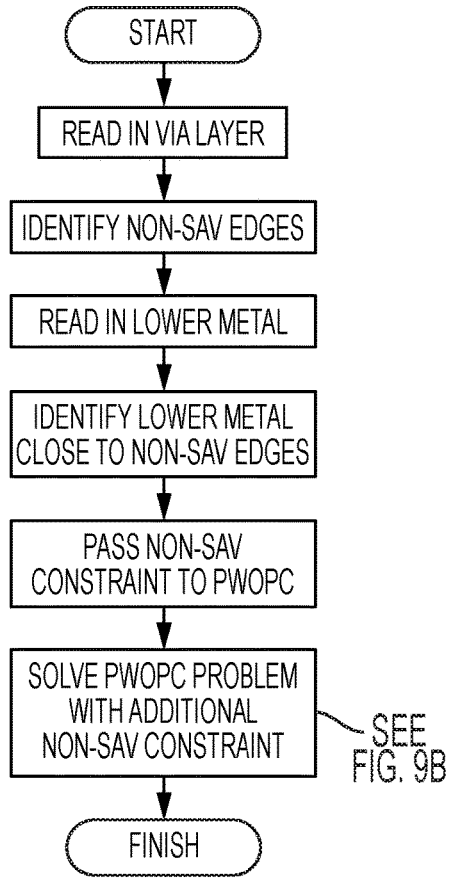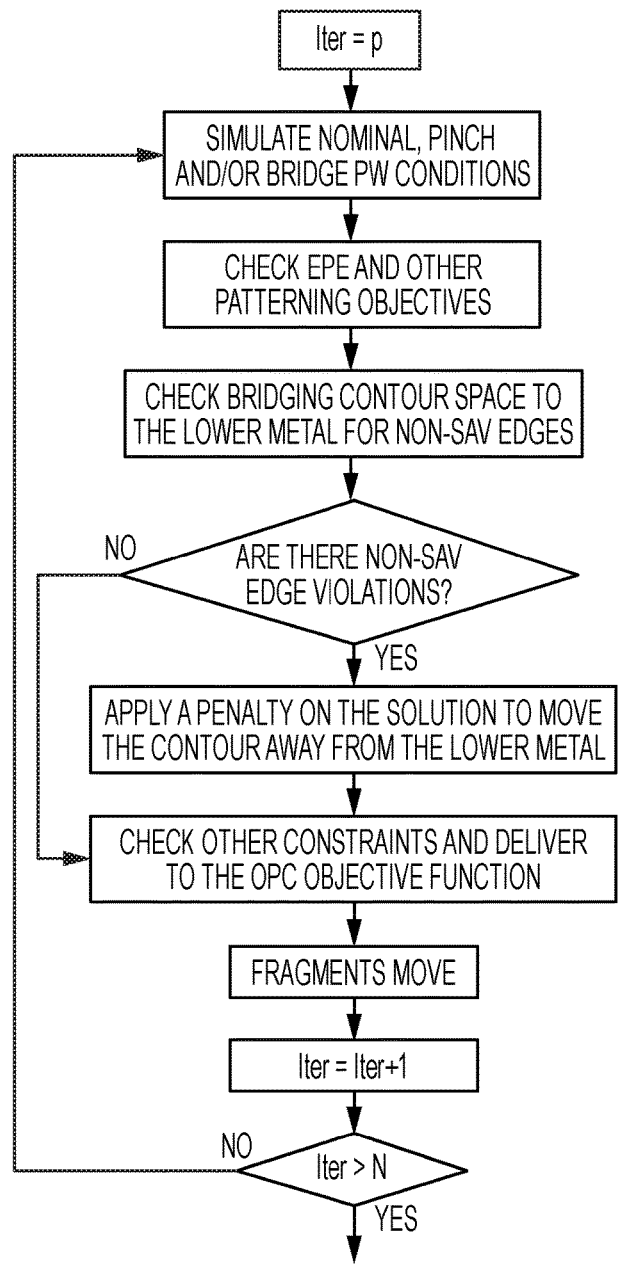
FIG. 9A
FIG. 9B

METHODOLOGY FOR MODEL-BASED SELF-ALIGNED VIA AWARENESS IN OPTICAL PROXIMITY CORRECTION

BACKGROUND

The present application relates generally to semiconductor device manufacture, and more specifically to an optical proximity correction (OPC) method for forming a lithography mask.

Advances in integrated circuit (IC) materials and design have yielded generations of ICs where successive generations have smaller and more complex circuits. As ICs evolve, the functional density (i.e., the number of interconnected devices per unit area) has generally increased and the critical dimension (i.e., the minimum feature size) has decreased. While dimensional scaling improves performance, increases production efficiency, and lowers costs, it has also increased the complexity of processing and manufacturing.

SUMMARY

Notwithstanding recent developments, there is a need for improved methods of semiconductor device manufacture and feature patterning. The present application relates to an optical proximity correction (OPC) method of preparing data for forming a mask for use in defining self-aligned vias.

Self-aligned via (SAV) processes are ubiquitous in semiconductor technology patterning for advanced technology nodes. A characteristic of the SAV process is that the via pattern can have near vertical sidewalls proximate to an upper metal layer, which beneficially impacts scaling and allows for compact designs. However, via sidewalls that are spaced away from edges of the upper metal layer may be sloped, which can create yield and reliability concerns in addition to the requirement for additional design space in these non-SAV directions.

As disclosed herein, a model-based approach is used in conjunction with an SAV process to avoid encroachment of non-SAV edges upon lower metal layers while avoiding an intolerable real estate penalty. Specifically, an additional constraint is introduced to the optical proximity correction (OPC) methodology to avoid locating the outer via contour within a critical distance from the lower metal.

In accordance with embodiments of the present application, a method of providing self-aligned via awareness in OPC includes identifying non-SAV edges, identifying any lower metal structure that is within a critical distance from the non-SAV edges, and defining replacement non-SAV edges proximate to the lower metal structure using a distance constraint that is evaluated as part of the OPC objective function to redefine the mask solution and relocate the non-SAV edges away from the lower metal structure.

An example method of providing a mask layout for an integrated circuit includes defining a mask layout corresponding to a self-aligned via, where the mask layout has an outer via contour, and creating a lithographic model for the self-aligned via, such that the model describes processes by which an image is transferred from the mask to a substrate.

The method further includes determining a simulated substrate image resulting from transferring the mask layout in accordance with the model, and evaluating the simulated substrate image subject to functional constraints relative to a metal layer disposed over the substrate, where if the constraints are violated, the mask layout is modified to increase a distance between the outer via contour and the metal layer. In certain embodiments, computer program product is configured to perform the method of defining the mask layout.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2 is a top-down plan view schematic illustration of a self-aligned via structure at an intermediate stage of fabrication;

FIG. 2A is a cross-sectional view along the line A-A' of FIG. 2 showing a patterned upper metal hard mask and a patterned via hard mask disposed over an interlayer dielectric and a pre-patterned lower metal layer;

FIG. 2B is a cross-sectional view along the line B-B' of FIG. 2 showing a patterned upper metal hard mask and a patterned via hard mask disposed over the interlayer dielectric;

FIG. 9A is a flow chart detailing an example SAV-aware OPC methodology;

FIG. 9B is a flow chart showing implementation of SAV awareness within a process window OPC flow;

DETAILED DESCRIPTION

Figure 1:
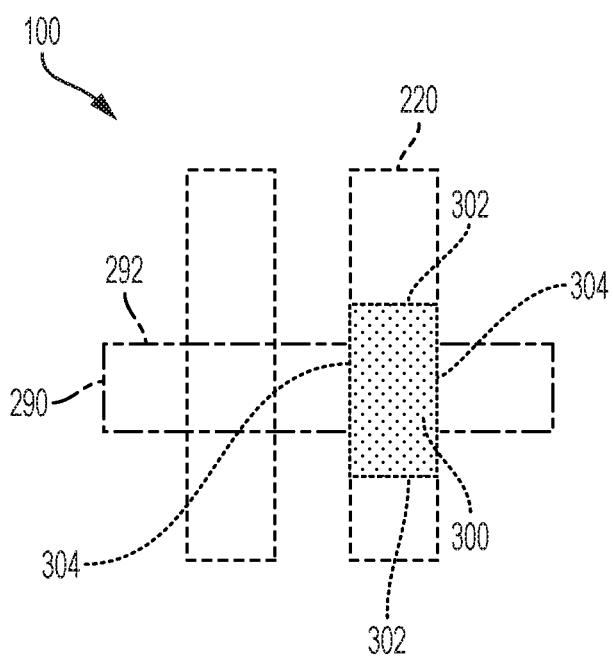
FIG. 1 is a top-down plan view schematic of an example self-aligned via (SAV) architecture.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a method for incorporating self-aligned via related constraints in a model based optical proximity correction (OPC) software tool for use in an optical lithography system to provide accurate correction of device shapes in a photomask for IC manufacture.

The photolithography process involves duplicating desired circuit patterns onto semiconductor wafers to achieve an overall desired circuit performance. The desired circuit patterns are commonly represented as opaque, complete and semi-transparent regions on a template typically referred to as a photomask. In photolithography, patterns on the photomask template are projected onto a photoresist-coated substrate (e.g., semiconductor substrate) by way of optical imaging through an exposure system.

The photolithographic process used to form a physical layer on a substrate includes designing one or more mask shape layouts used to transfer the circuit design shapes to the substrate. Optical proximity correction (OPC) is a process used to refine the shapes on the mask so that the transfer of mask patterns to the physical layer reproduces the desired circuit design shapes with optimal fidelity.

In accordance with various embodiments, optical proximity correction algorithms pre-correct shapes formed on a photomask by segmenting the shape edges and shifting the position of the segments by minor amounts. OPC software emulates the physical and optical effects that are principally responsible for the non-fidelity of mask shapes printed on the substrate.

In the correction phase of OPC, the mask shapes are iteratively modified so that the shapes printed on the wafer match the desired shape. This method automatically perturbates existing mask shapes to achieve the target dimensions on the wafer.

Optical proximity correction is commonly used to compensate for image errors resulting from diffraction or process effects. The diffraction of light in optical lithography systems, for instance, is an obstacle to feature size scaling. The implementation of OPC derives at least in part from the limitations of light to maintain edge placement (e.g., etched image) fidelity of an original design after processing. OPC endeavors to achieve a mask design that generates a printed structure that matches the design intent, including feature size and placement.

During photolithography, projected images commonly appear with irregularities such as line widths that are narrower or wider than designed. Other distortions such as rounded corners may be driven by the resolution of the optical imaging tool. Such distortions, if not corrected, may significantly alter the performance and reliability of the intended device. Optical proximity correction addresses these potential errors by moving edges or adding extra features to the pattern written on a photomask. The OPC objective function (E) incorporates the process variation information.

The adjustments to the mask layout may be rule-based and obtained from pre-computed data based on, for example, the width and spacing between features, or model-based using dynamic calculations to simulate the final pattern and thereby define an initial pattern that produces the intended solution.

According to various embodiments, optical proximity correction is used in conjunction with a self-aligned via (SAV) process to produce the via-defining mask. In various embodiments, disclosed is a method to modify a mask produced by OPC to include SAV awareness using an additional constraint between a via simulation and a lower metal pattern in the non-SAV direction such that the risk for electrical shorts (e.g., inter-via bridging) in the non-SAV direction is decreased.

A self-aligned via (SAV) process, which may be implemented as a back end of the line (BEOL) module for interconnecting metal wires, is described herein with reference to FIGS. 1-8. FIGS. 1-8 also serve to explain a patterning phenomenon associated with the SAV process and an attendant vulnerability, which is addressed by the OPC methodology described herein.

Referring to FIG. 1, illustrated is a top-down plan view schematic of an example self-aligned via architecture 100, including lower metal target locations 220, upper metal target location 290, and a via target location 300 for defining a via through which a lower metal layer formed within the lower metal target location 220 will be in electric contact with an upper metal layer formed within the upper metal target location 290.

Via target location 300 includes self-aligned edges 302, which are arranged parallel to adjacent edges 292 of the upper metal target location 290, and non-self-aligned edges 304, which are arranged orthogonal to the adjacent upper metal target location edges 292.

Referring to the top-down plan view of FIG. 2, the self-aligned via architecture 100 is superimposed on a metallization structure formed over a semiconductor substrate (not shown). As depicted in the cross-sectional views of FIGS. 2A and 2B, the metallization structure includes a pre-patterned lower metal layer 420, including a first metal line 421 and a second metal line 422, and an interlayer dielectric (ILD) 430 disposed over the lower metal layer 420 and between patterned features thereof (e.g., between first and second metal lines 421, 422). An upper metal hard mask 440 and a via hard mask 450 are formed sequentially over the interlayer dielectric 430 and patterned to include openings for defining an upper metal layer and a via extending through the ILD 430 to the second metal line 422 within the lower metal layer 420.

As will be appreciated, FIG. 2A is a cross-sectional view of the structure shown in FIG. 2 between self-aligned edges 302 (i.e., an SAV cross-section taken along the line A-A') and FIG. 2B is a cross-sectional view between non-self-aligned edges 304 (i.e., a non-SAV cross-section taken along the line B-B'). In a similar vein, each of FIGS. 3A-8A depicts an SAV cross-sectional view, while each of FIGS. 3B-8B depicts a non-SAV cross-sectional view.

In an example process, patterning of the upper metal layer hard mask 440 precedes patterning of the via hard mask 450. As seen in FIG. 2A, in the SAV cross-section, the opening in the via hard mask 450 is wider than the opening in the upper metal hard mask 440, while in the non-SAV cross-section of FIG. 2B, the opening in the via hard mask 450 is narrower than the opening in the upper metal hard mask 440.

Figure 3A:
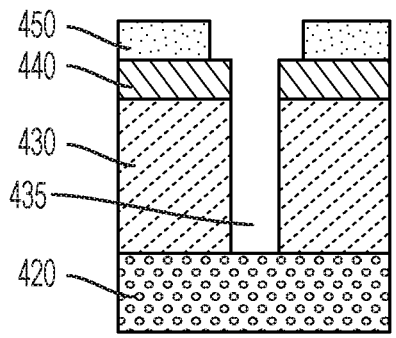
FIG. 3A is a self-aligned via (SAV) cross-sectional view of the structure of FIG. 3.
Figure 3B:
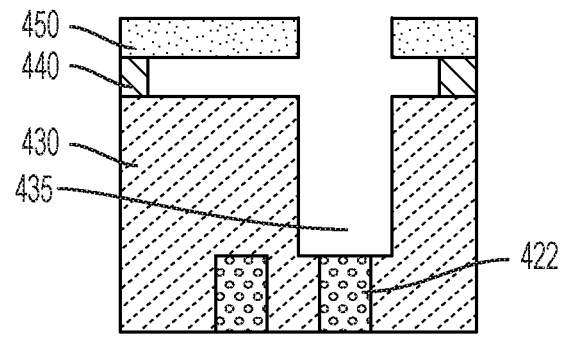
FIG. 3B is a non-self-aligned via (SAV) cross-sectional view of the structure of FIG. 3.
Figure 3:
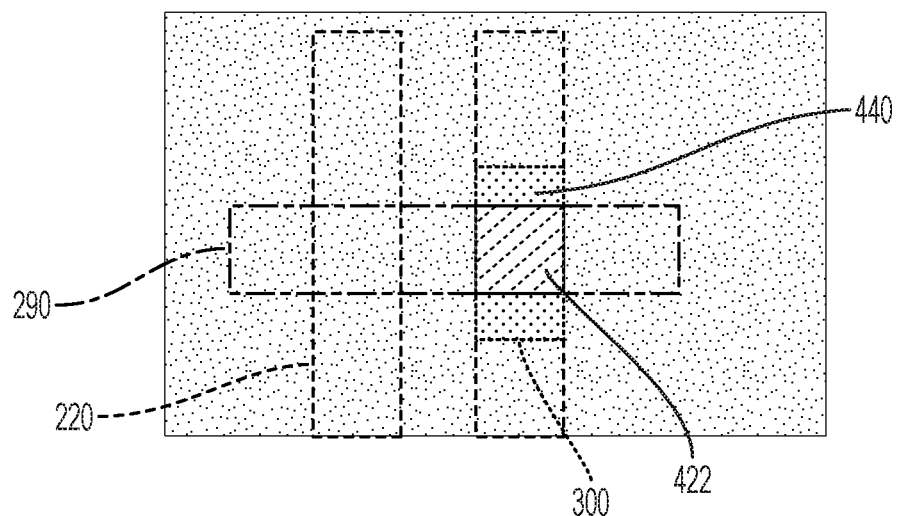
FIG. 3 is a top-down plan view schematic of the self-aligned via structure following a via etch.

Referring to FIG. 3, using the upper metal hard mask 440 and the via hard mask 450 as etch masks, a via etch process such as a reactive ion etch (RIE) process is used to define a via 435 extending through the interlayer dielectric 430 to an upper surface of lower metal layer 420, e.g., an upper surface of second metal line 422. The via etch process may be a directional (anisotropic) etch process where the resulting via sidewalls in both the SAV cross-section and the non-SAV cross-section are substantially vertical, as depicted in FIGS. 3A and 3B, i.e., orthogonal to a major surface of the substrate.

Figure 4A:
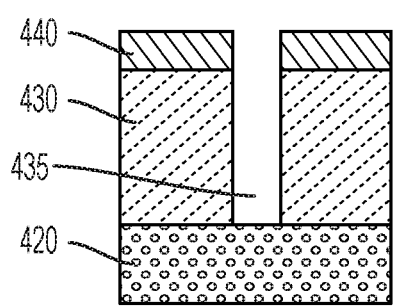
FIG. 4A is a self-aligned via cross-sectional view of the structure of FIG. 4 showing the upper metal hard mask disposed over the interlayer dielectric.
Figure 4B:
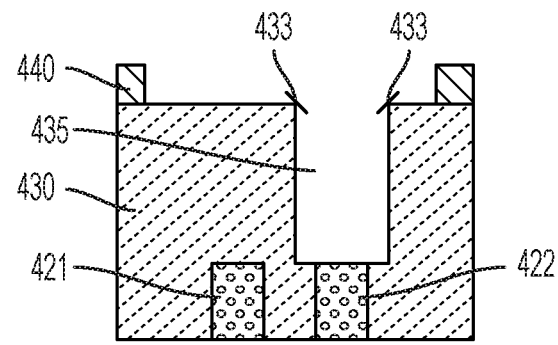
FIG. 4B is a non-self-aligned via cross-sectional view of the structure of FIG. 4 showing the upper metal hard mask disposed over a portion of the interlayer dielectric.
Figure 4:
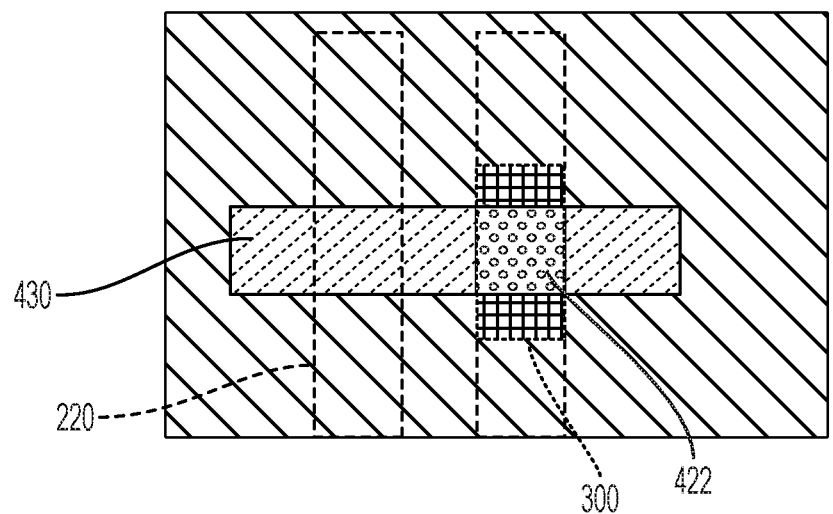
FIG. 4 is a top-down plan view schematic view following selective removal of the via hard mask.

Referring to FIG. 4, following the via etch, the via hard mask 450 is removed using an etch process selective to the upper metal hard mask 440. As seen in FIG. 4A, in the SAV cross-section, sidewalls of via 435 are aligned (i.e., substantially co-planar) with sidewalls of the upper metal hard mask 440. However, as seen in FIG. 4B, in the non-SAV cross-section, sidewalls of the via 435 are laterally offset from sidewalls of the upper metal hard mask 440. Thus, proximate to the via target location 300, dielectric layer 430 is blocked by the upper metal hardmask 440 in the SAV direction, while dielectric layer 430 is exposed in the non-SAV direction. During an etching process to form a trench in dielectric layer 430 for the upper metal layer, exposed portions of the dielectric layer 430 will be etched, including highlighted corners 433.

Figure 5A:
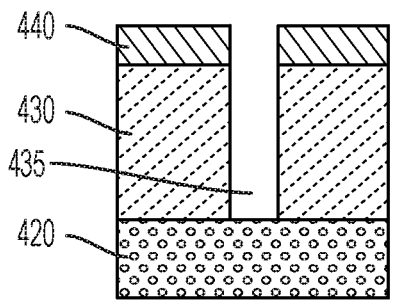
FIG. 5A is a cross-sectional view showing minimal impact of the trench etch along the self-aligned via cross-section.
Figure 5B:
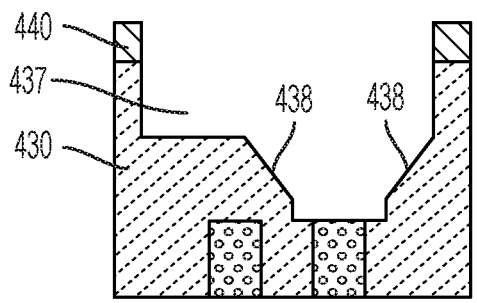
FIG. 5B is a non-self-aligned via cross-sectional view of the structure of FIG. 5 showing widening of the via above a first metal line and proximate to a second metal line of the lower metal layer.
Figure 5:
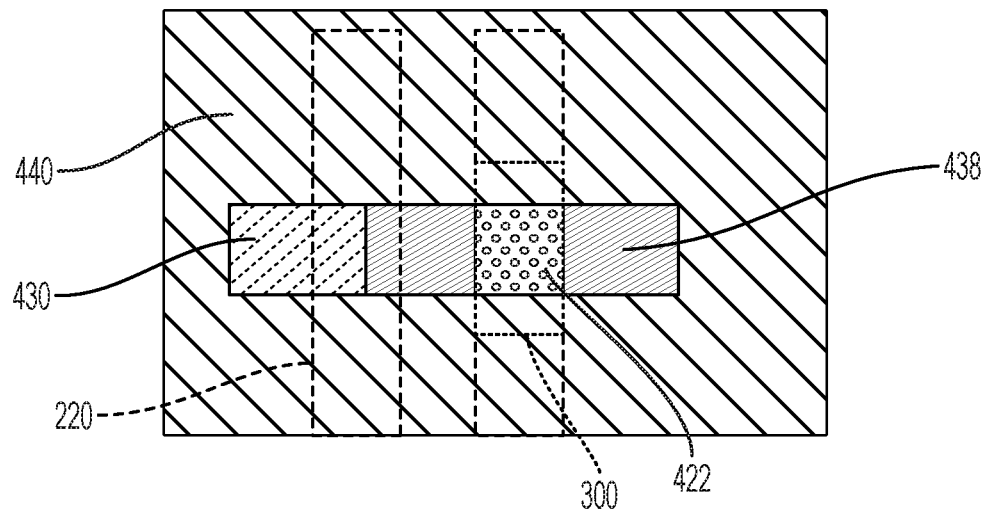
FIG. 5 is a top-down plan view schematic following etching of the interlayer dielectric to form an upper metal layer trench.

Referring to FIG. 5, an etching process is used to form a trench 437 for the upper metal layer. Using the upper metal hard mask 440 as a mask, exposed portions of the dielectric layer 430 are etched. However, as shown in FIG. 5B, the etch used to form trench 437 also removes dielectric material from the sidewalls of the via 435, which results in the creation of tapered sidewalls 438 within via 435 along the non-SAV cross-section. As shown in FIG. 5A, however, due to the overlying upper metal hard mask 440, edges of the via 435 in the SAV cross-section are largely unaffected by the trench etch.

Figure 6A:
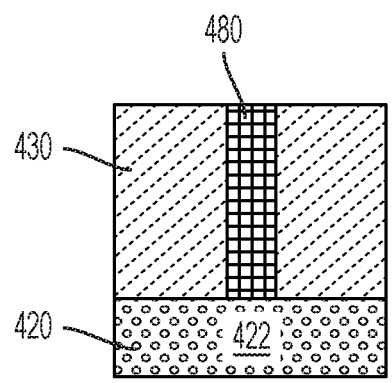
FIG. 6A is an SAV cross-sectional view showing the upper metal layer contacting the lower metal layer.
Figure 6B:
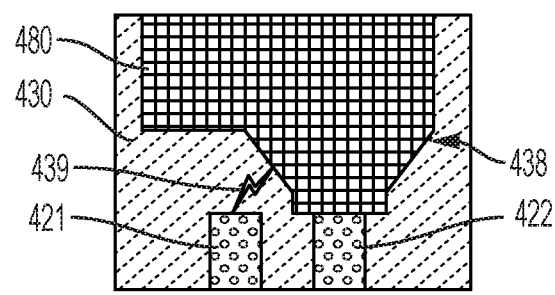
FIG. 6B is a non-SAV cross-sectional view showing the upper metal layer contacting the first metal line.
Figure 6:
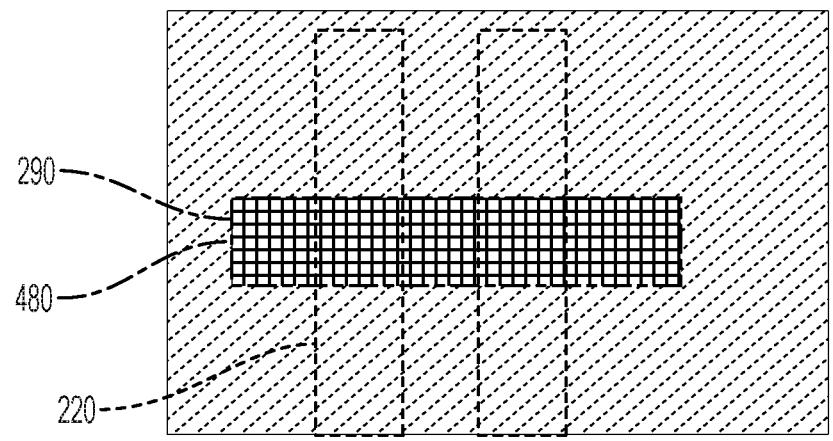
FIG. 6 is a post-planarization architecture following deposition of an upper metal layer into the via and into the upper metal layer trench.

Referring to FIG. 6, a conductive material is deposited within via 435 and trench 437, to form an upper metal layer 480 in electrical contact with the lower metal layer 420, e.g., in electrical contact with second metal line 422. In various embodiments, upper metal layer 480 may be blanket depositing using, for example, atomic layer deposition, and may comprise copper, cobalt, titanium, or tungsten, as well as alloys and compounds thereof.

Once the vias 435 and trenches 437 have been filled, the upper metal layer 480 is polished to remove the overburden and planarize the structure. For instance, grinding or chemical mechanical polishing (CMP) may be used to planarize the structure as illustrated in FIGS. 6A and 6B. The dielectric layer 430 may function as a CMP etch stop.

Referring still to FIGS. 6A and 6B, while upper metal layer 480 is electrically connected to second metal line 422, upper metal layer 480 is electrically isolated from first metal line 421 by remaining portions of dielectric layer 430. However, in various embodiments, along the non-SAV cross-section, the formation during the trench etch of tapered sidewalls 438 within via 435 may create a region 439 within the via 435 at risk of bridging (i.e., shorting) to first metal line 421.

As a result of the pattern (mask) asymmetry between the SAV direction and the non-SAV direction, the via 435 prints essentially as intended along the SAV cross-section. However, in the non-SAV direction, the via prints elliptically with a relatively large ratio between major and minor axes.

Figure 7:
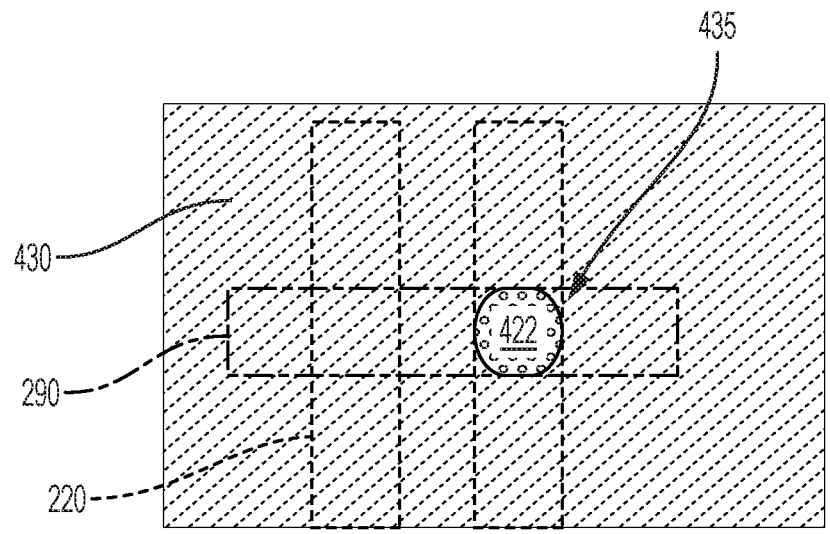
FIG. 7 is a top-down plan view showing the via pattern at the bottom of the via.
Figure 8:
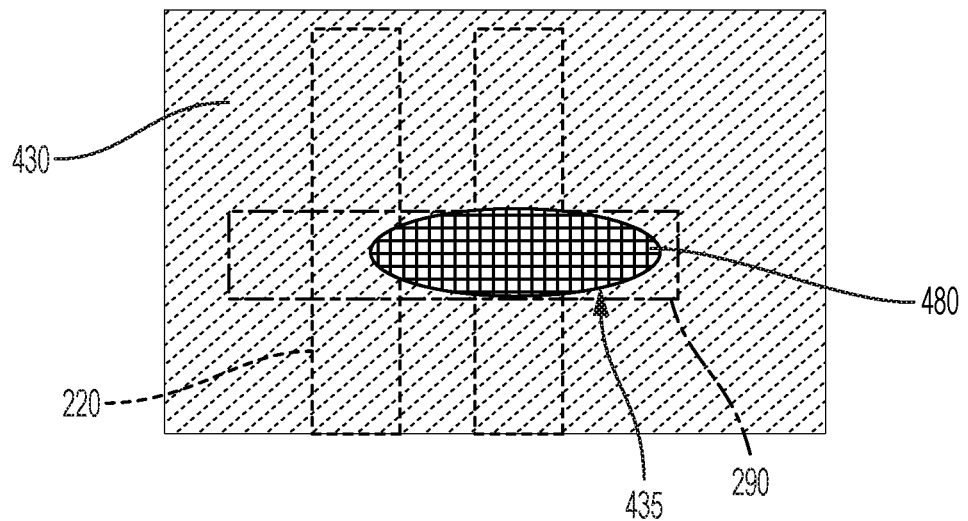
FIG. 8 is a top-down plan view showing the via pattern at the top of the via.

This phenomenon, which is illustrated in FIGS. 7 and 8, may locate a via edge within a critical distance ($d_c$) from the first metal line 421, which can create undesired parasitic effects or an unintended electrical short between the upper metal layer 480 and the lower metal layer 420 that adversely affect device reliability and manufacturing throughput. As used herein, the placement of a via edge within a critical distance of a lower metal line correlates to an unacceptable statistical probability of device failure.

In accordance with embodiments of the present application, in performing a correction to via placement, the optical proximity correction (OPC) is directed to consider additional constraints, including the location of the lower metal layer and the locations of the SAV and non-SAV via edges. Thus, in accordance with various embodiments, the OPC contemplates interlayer connections and the SAV etch phenomenon described above.

Each iteration of the OPC performs a simulation and determines if the via placement satisfies an edge placement error (EPE), which is a quantitative representation of the deviation of the edges of a simulated mask image with respect to the edges of the target image. Typically, EPE tolerances are expressed as geometric rules or constraints on the image shapes relative to shapes on the same physical layer. If the image does not remain within tolerance or the allowable EPE, the segment is iteratively moved forward or backward until all of the simulated image edges are located within an accepted tolerance of the location of the target image edges. Eventually, the final corrected mask layout is outputted.

Referring to FIG. 9A, illustrated is a flowchart of an example OPC method that incorporates self-aligned via data into the mask solution. The method includes reading data associated with the geometry of the target via layer, identifying non-SAV edges amongst the via etch target data, reading lower metal target data associated with the geometry of the lower metal layer, and identifying portions of the lower metal target situated within a critical distance of the non-SAV edges. The constraint(s) associated with the allowable proximity between non-SAV edges and the lower metal layer is provided to the OPC (or process window OPC), which enables the OPC to generate a mask solution subject to the constraint(s).

Referring to FIG. 9B, illustrated in additional detail is an example OPC algorithm, which includes the implementation of SAV-derived constraints. In various embodiments, the SAV-related constraints may be considered after one or more OPC iterations and the formulation of an initial simulation based on broader constraints. Thus, in FIG. 9B, "p" is the first process window OPC (PWOPC) iteration that will consider the SAV data, but not necessarily the first overall OPC iteration used to define the mask, i.e., p>1.

In an initial step, the OPC performs one or more simulations based on nominal, pinch and/or bridge process window (PW) constraints, which can be used to account for a variety of process variabilities. The nominal constraint assumes the idealized condition of no mask errors, no focus aberrations, no energy (e.g., dose) variations, etc. Generally, pinch and bridge constraints correlate to features or structures that have a tendency to print either too small or too large, respectively. An edge placement error (EPE) comparison of the simulated pattern to the target pattern is made to assess whether the simulation is converging on a solution.

The OPC then checks the simulation for non-SAV edges and evaluates if there are any proximity ($d<d_c$) violations between the non-SAV edges and the lower metal layer. In the absence of any violation, the EPE evaluation performs an assessment of other patterning objectives, which may include assessing the risk of via-to-via bridging or pinching of the vias. In response to an SAV critical distance violation, the OPC moves the offending non-SAV edge away from the lower metal layer. In various embodiments, the OPC simulation can be repeated over a finite number of iterations, where the total number of iterations ("iter") is equal to N. After N iterations, the methodology outputs a completed mask.

In certain embodiments, rather than shifting the entire via away from potential contact with a lower metal layer, a correction may be made to only a portion of the via contour. For instance, the location of one or more non-SAV edges may be moved while SAV edges are not moved. By way of further example, the location of one or more non-SAV edges may be moved by a first amount while SAV edges are moved by a second amount that is different than (e.g., less than) the first amount.

Figure 10:
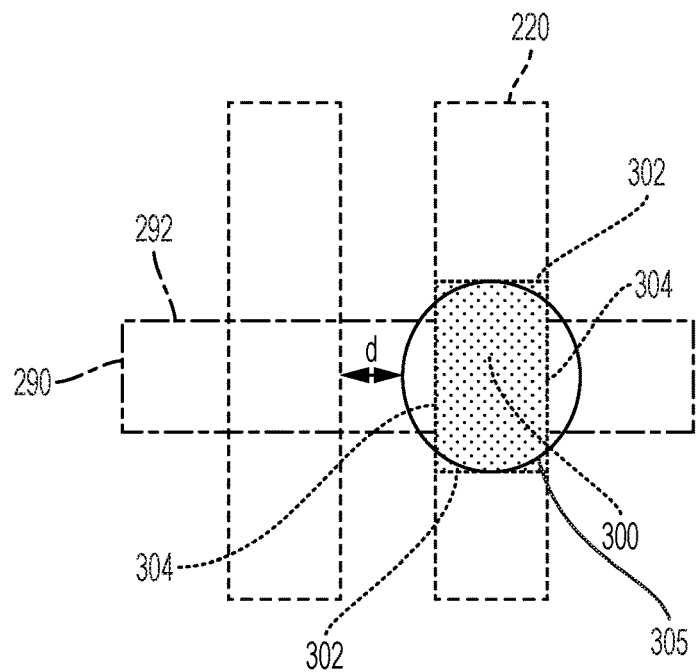
FIG. 10 is a top-down plan view schematic of an example self-aligned via architecture showing an at-risk target post via etch contour.

Referring to FIG. 10, illustrated is a top-down plan view schematic of an example self-aligned via architecture showing an at-risk target post-via etch contour 305, where a distance (d) across an at-risk region 439 is less than a critical distance ($d_c$). The architecture of FIG. 10 does not pass an EPE criterion.

Figure 11:
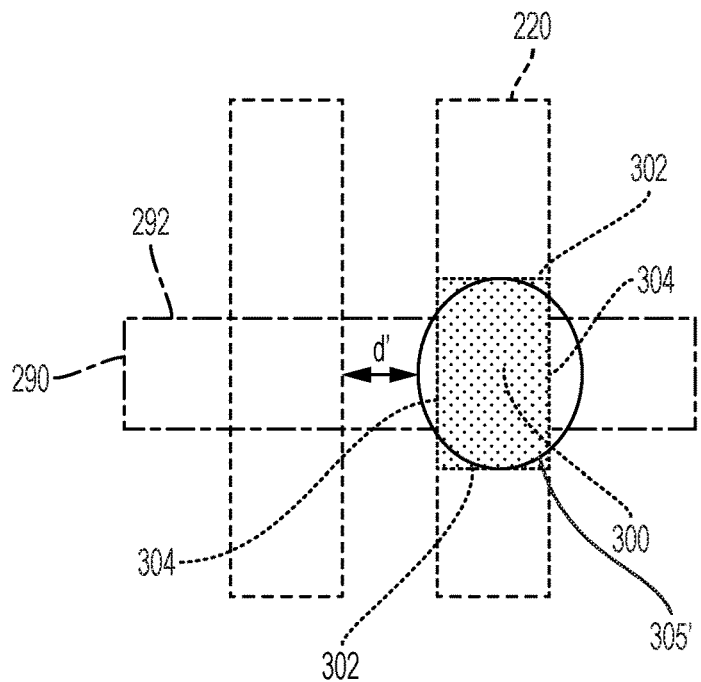
FIG. 11 is a top-down plan view schematic of an example self-aligned via architecture showing an SAV-aware OPC contour.

A revised architecture is shown in FIG. 11, which is a top-down plan view schematic of an example self-aligned via architecture showing an SAV-aware OPC contour 305', where the via printing respects the adjacent lower metal layer along non-SAV edges 304. In the illustrated embodiment, a non-SAV edge of the target post-etch via contour 305' is shifted such that a distance (d') across an at-risk region 439 is greater than or equal to a critical distance ($d_c$). The revised architecture of FIG. 11 passes an EPE criterion.

An example method of providing self-aligned via awareness in OPC includes identifying non-SAV edges, identifying any lower metal structure that is within a critical distance from the non-SAV edges, and defining one or more replacement non-SAV edges proximate to the lower metal structure using a distance constraint that is evaluated as part of the OPC objective function to redefine the mask solution and relocate the non-SAV edges away from the lower metal structure.

Figure 12:
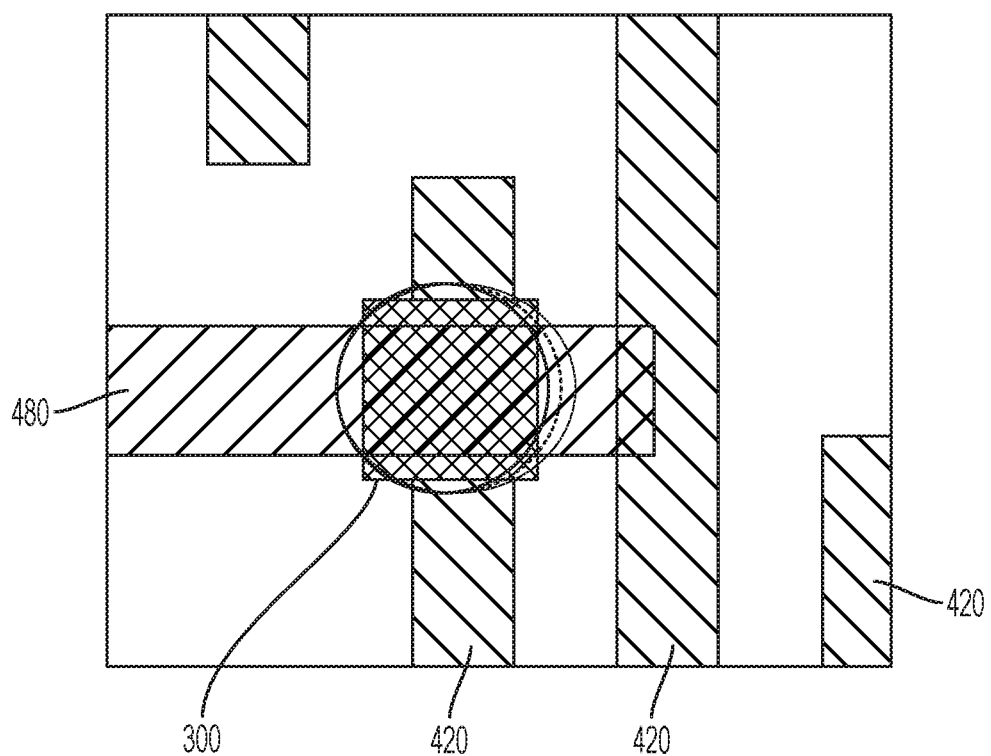
FIG. 12 is modeled data showing the impact of the SAV-aware OPC methodology on via target locations according to various embodiments.
Figure 13:
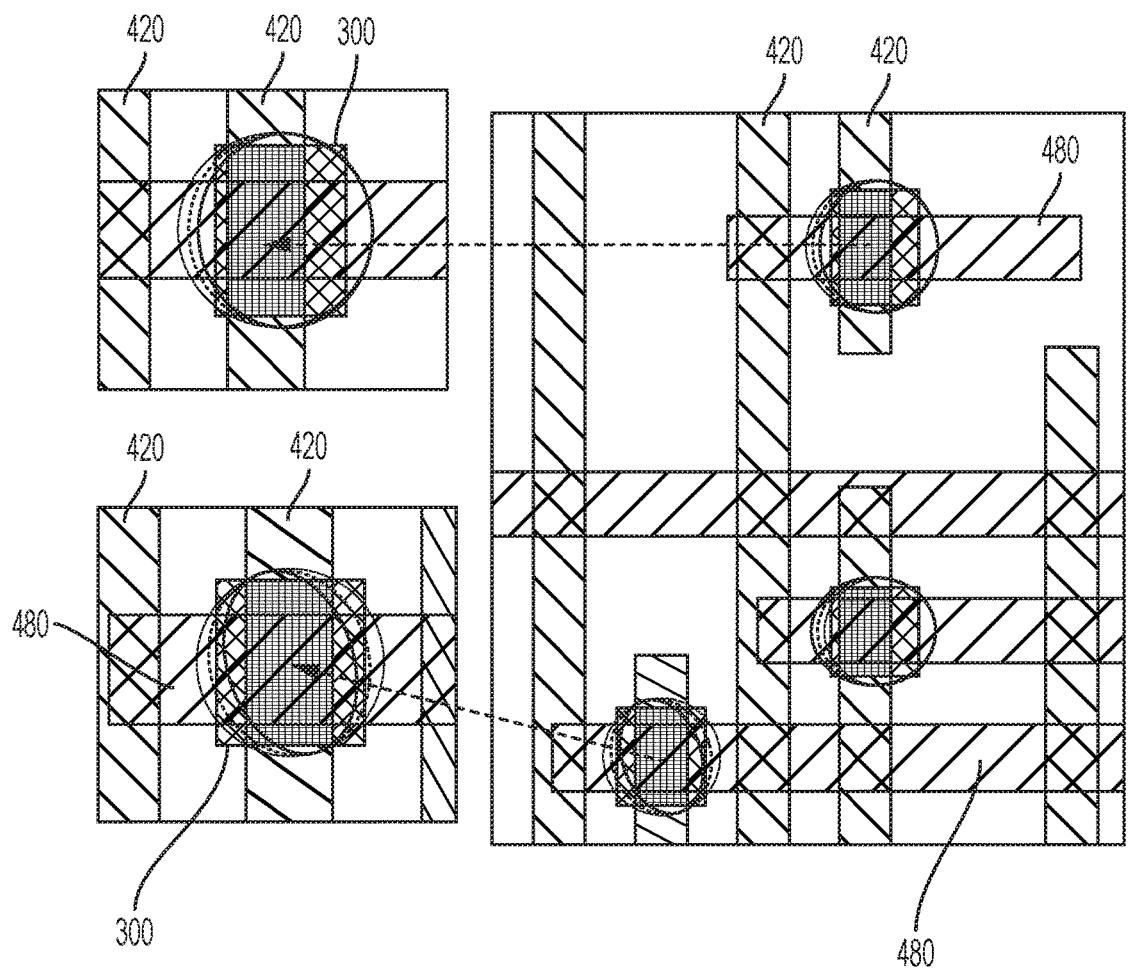
FIG. 13 is modeled data showing the impact of the SAV-aware OPC methodology on via target locations according to various embodiments.
Figure 14:
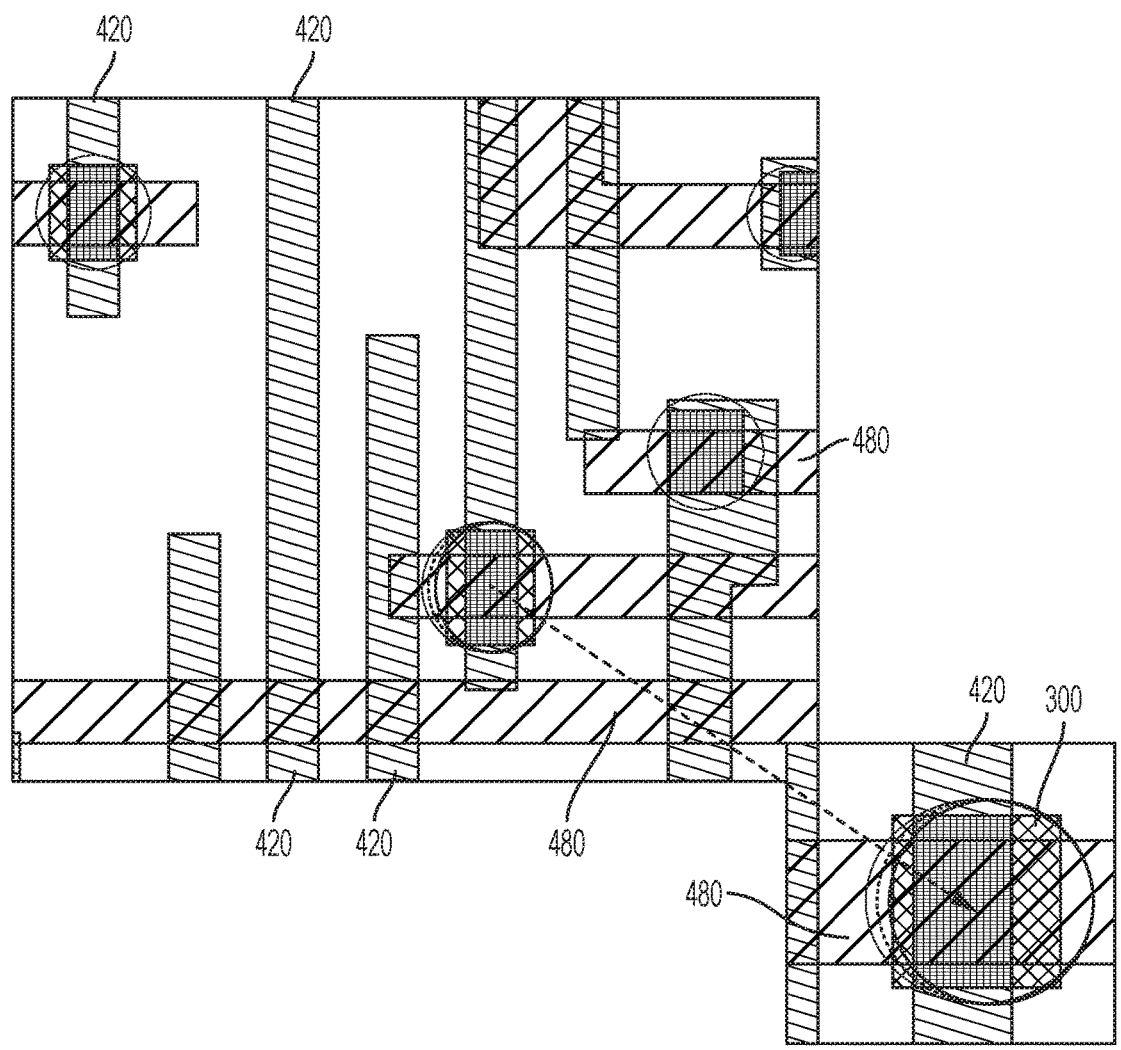
FIG. 14 is modeled data showing the impact of the SAV-aware OPC methodology on via target locations according to various embodiments.

Simulation data for various SAV architectures are shown in FIGS. 12-14. The data in each figure include simulated post-etch via contours 305A, 305B and 305C, which correspond to increasingly aggressive application of the SAV-awareness criteria. The comparative contours 305A are defined without SAV awareness. The data illustrate the redefinition of the mask solution and concomitant relocation of at least one non-SAV edge away from a lower metal structure.

Disclosed is a model-based methodology for self-aligned via aware OPC. The method allows OPC to comprehend areas at risk of bridging to lower metal structures and incorporates such information into its objective function. Without wishing to be bound by theory, it is believed that the model-based judgment provides a more accurate decision and correction during OPC compared to other rules-based techniques, which can be used to control the SAV process and improve manufacturing yield and beneficially impact device performance and reliability.

In contrast to a retargeting solution, for example, which typically affects upper and lower metal layers in addition to the entire via, in various embodiments the revised mask solution is minimally invasive, where re-patterning is directed only at the portion(s) of the via at risk. Furthermore, the current model-based approach can resolve designs that are at risk in both SAV and non-SAV dimensions, while conventional retargeting techniques typically require additional space in a second dimension in order to accommodate a via shift in response to a perceived risk in a first dimension.

Embodiments of the present disclosure are used in optical lithography to correct for distortions on a photomask having patterns of circuit design features in order to achieve an accurate projection of the patterns onto a photoresist coated substrate. Model-based OPC is performed in which edge placement error (EPE) constrains are modified to include SAV-derived constraints. The method has been demonstrated to improve patterning quality, and correspondingly enhance manufacturing yield as well as device performance and reliability by addressing a known failure mechanism.

Figure 15:
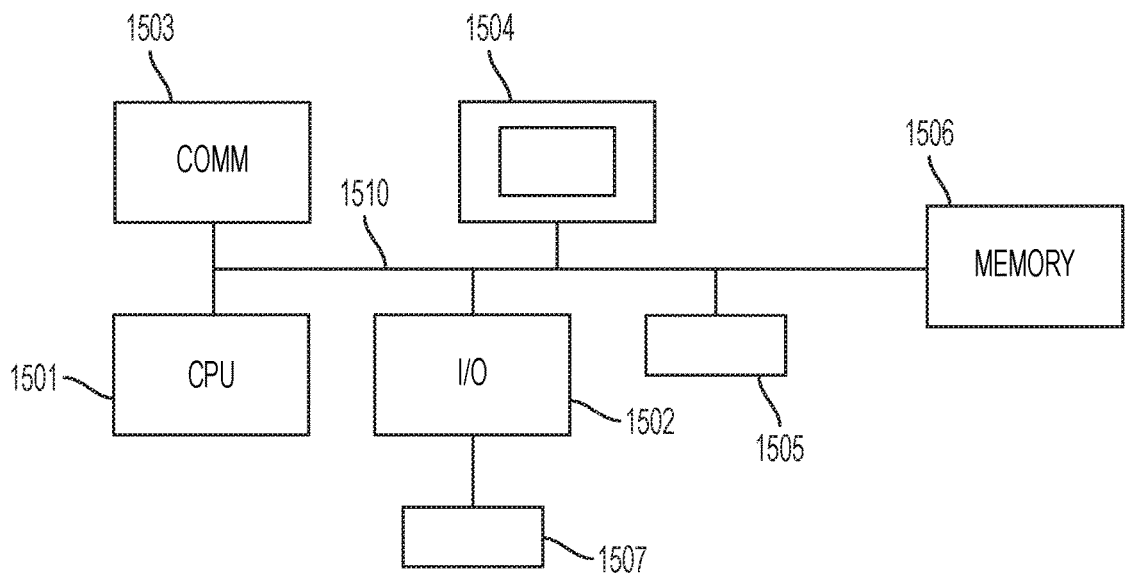
FIG. 15 is a schematic illustration of a computer system and computer program product adapted to perform the presently-disclosed method.

Embodiments of present method may be implemented in a digital computer, or computer system, as shown schematically in FIG. 15. Components of an exemplary computer or computer system include a central processing unit (CPU) 1501, an input/output (I/O) device 1502 (such as a keyboard, mouse, compact disk (CD) drive, etc.), a controller 1503, a display device 1504, a storage device 1505 capable of reading and/or writing computer readable code, and memory 1506. The foregoing are typically connected, e.g., by a bus or a communications network 1510.

Various embodiments may be implemented as a computer program product stored on a computer readable medium 1507, such as a tape or CD, or on the storage device 1505. The computer program product contains instructions to implement the method on a computer.

As used herein, the singular forms "a," "an" and "the" include plural referents unless the context clearly dictates otherwise. Thus, for example, reference to a "via contour" includes examples having two or more such "via contours" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a via that comprises tungsten include embodiments where the via consists essentially of tungsten and embodiments where the via consists of tungsten.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a photolithography mask for integrated circuit manufacture comprising:
   providing a mask layout for an integrated circuit using a mask layout method, the mask layout method implemented by a computer program stored in a computer readable non-transient storage medium, the mask layout method comprising:
      defining a mask layout corresponding to a self-aligned via, the mask layout comprising an outer via contour;
      creating a lithographic model for the self-aligned via, the model describing processes by which an image is transferred from the mask to a substrate;
      determining a simulated substrate image resulting from transferring the mask layout in accordance with the model;
      evaluating the simulated substrate image subject to functional constraints relative to a metal layer disposed over the substrate, the functional constraints including a condition that the outer via contour is separated from the metal layer by a distance that ensures that a metal disposed within the via is electrically isolated from the metal layer;
      if the constraints are violated, modifying the mask layout to increase a distance between the outer via contour and the metal layer; outputting the mask layout; and
   forming, from the outputted mask layout, a photolithography mask for integrated circuit manufacture.

2. The method of claim 1, wherein the outer via contour comprises self-aligned via edges and non-self-aligned via edges.

3. The method of claim 1, wherein the mask layout is modified to increase the distance between a non-self-aligned via edge and the metal layer.

4. The method of claim 3, wherein the mask layout is modified to increase a distance between a second non-self-aligned via edge and a second metal layer.

5. The method of claim 1, wherein the mask layout is modified to increase the distance between a non-self-aligned via edge and the metal layer without increasing a distance between a self-aligned via edge and the metal layer.

6. The method of claim 1, wherein modifying the mask layout comprises dividing the outer via contour into a plurality of segments.

7. The method of claim 1, wherein modifying the mask layout comprises performing an OPC convergence simulation.

8. The method of claim 1 further comprising using the photolithographic mask to manufacture an integrated circuit.

9. A computer program product for forming a photolithography mask for integrated circuit manufacture, the computer program product comprising a non-transitory computer readable storage medium having a computer readable program embodied in the medium for providing a mask layout for an integrated circuit, wherein the computer readable program when executed on a computer causes the computer to perform the steps of:
   defining a mask layout corresponding to a self-aligned via, the mask layout comprising an outer via contour;
   creating a lithographic model for the self-aligned via, the model describing processes by which an image is transferred from the mask to a substrate;
   determining a simulated substrate image resulting from transferring the mask layout in accordance with the model;
   evaluating the simulated substrate image subject to functional constraints relative to a metal layer disposed over the substrate, the functional constraints including a condition that the outer via contour is separated from the metal layer by a distance that ensures that a metal disposed within the via is electrically isolated from the metal layer; and
   if the constraints are violated, modifying the mask layout to increase a distance between the outer via contour and the metal layer.

10. The computer program product of claim 9, wherein the outer via contour comprises self-aligned via edges and non-self-aligned via edges.

11. The computer program product of claim 9, wherein the mask layout is modified to increase the distance between a non-self-aligned via edge and the metal layer.

12. The computer program product of claim 11, wherein the mask layout is modified to increase a distance between a second non-self-aligned via edge and a second metal layer.

13. The computer program product of claim 9, wherein the mask layout is modified to increase the distance between a non-self-aligned via edge and the metal layer without increasing a distance between a self-aligned via edge and the metal layer.

14. The computer program product of claim 9, wherein modifying the mask layout comprises dividing the outer via contour into a plurality of segments.

15. The computer program product of claim 9, wherein modifying the mask layout comprises includes performing an OPC convergence simulation.

16. The computer program product of claim 9 further comprising outputting the mask layout for manufacture of a photolithography mask for integrated circuit manufacture.

* * * * *